US011258295B2

(12) United States Patent
Chen et al.

(10) Patent No.: US 11,258,295 B2
(45) Date of Patent: Feb. 22, 2022

(54) MAINTENANCE BYPASS ASSEMBLY FOR UNINTERRUPTABLE POWER SUPPLY

(71) Applicant: C&C Power, Inc., Carol Stream, IL (US)

(72) Inventors: Shujen Chen, Naperville, IL (US); Paul F. Matras, Arlington Heights, IL (US); Robert E. Bland, Schaumburg, IL (US); Paul Joseph Blake, Crystal Lake, IL (US); James Leo Leifker, Plainfield, IL (US)

(73) Assignee: C&C Power, Inc., Carol Stream, IL (US)

( * ) Notice: Subject to any disclaimer, the term of this patent is extended or adjusted under 35 U.S.C. 154(b) by 0 days.

(21) Appl. No.: 16/890,390

(22) Filed: Jun. 2, 2020

(65) Prior Publication Data

US 2020/0389045 A1    Dec. 10, 2020

Related U.S. Application Data

(60) Provisional application No. 62/859,402, filed on Jun. 10, 2019.

(51) Int. Cl.
  *H02J 9/00* (2006.01)
  *H02J 9/06* (2006.01)
  *H02J 9/08* (2006.01)

(52) U.S. Cl.
  CPC .............. *H02J 9/062* (2013.01); *H02J 9/066* (2013.01); *H02J 9/068* (2020.01); *H02J 9/08* (2013.01)

(58) Field of Classification Search
  CPC ....................................................... H02J 9/00
  See application file for complete search history.

(56) References Cited

U.S. PATENT DOCUMENTS

| | | | |
|---|---|---|---|
| 5,646,459 A | 7/1997 | Hatate et al. | |
| 5,939,799 A | 8/1999 | Weinstein | |
| 6,292,379 B1 | 9/2001 | Edevold et al. | |
| 6,629,247 B1 * | 9/2003 | Hall | H02J 9/06 713/300 |

(Continued)

OTHER PUBLICATIONS

Schneider Electric; Galaxy VX Drawings, Dwg. No. GVX500-750K1250-1500GCBC-SD; Jul. 9, 2018; 2 pages.
C&C Power Engineered Power Products; Sales Drawings, 90880 Series Wall Mount Maintenance Bypass Panel, 15A-225A, 120V/240V, 1Ø/3W/G, 3 Breaker, Interlock Configuration 2; 2012; 2 pages.

(Continued)

*Primary Examiner* — Hal Kaplan
*Assistant Examiner* — Joseph N Inge
(74) *Attorney, Agent, or Firm* — Crowell & Moring LLP

(57) ABSTRACT

Where an Uninterruptable Power Supply (UPS) is used in a system to ensure highly reliable power supply to an electronic system, occasional maintenance or repair of the UPS or its storage batteries may be required. Effecting this servicing while ensuring that the utility power continues to be supplied to the load may involve a Maintenance Bypass Assembly (MBA) comprising a plurality of manually-operated circuit breakers. The possibility of an incorrect actuation of such circuit breakers is precluded by the coordination of a plurality of electromechanically actuated circuit breakers in communication with a controller that may store a table of permitted state transitions and sequences for safe operation. Such operation may be confirmed by one or more sensors monitored by the controller.

13 Claims, 10 Drawing Sheets

(56) References Cited

U.S. PATENT DOCUMENTS

| | | | |
|---|---|---|---|
| 7,485,988 B2* | 2/2009 | Lin | H02J 9/061 |
| | | | 307/66 |
| 8,772,969 B2* | 7/2014 | Jung | H02J 9/061 |
| | | | 307/86 |
| 8,772,983 B2 | 7/2014 | Filippenko et al. | |
| 8,853,887 B2 | 10/2014 | Silberbauer et al. | |
| 9,384,931 B2 | 7/2016 | Fasano | |
| 9,748,797 B2 | 8/2017 | Steinert et al. | |
| 9,882,423 B2 | 1/2018 | Olsen | |
| 10,224,741 B2 | 3/2019 | Oliver et al. | |
| 2010/0187908 A1* | 7/2010 | Okano | H02J 9/06 |
| | | | 307/64 |
| 2012/0119581 A1* | 5/2012 | Silberbauer | H02J 9/062 |
| | | | 307/66 |
| 2019/0064898 A1 | 2/2019 | Nommensen et al. | |

OTHER PUBLICATIONS

C&C Power Engineered Power Products; Sales Drawings, 90880 Series Wall Mount Maintenance Bypass Panel, 15A-225A, 120V/240V, 1Ø/3W/G, 3 Breaker with SKRU, Interlock Configuration 5; 2012; 2 pages.

LTI Power Systems; Elyria, Ohio; Static Transfer Switch, 20A to 125A Datasheet; 2 pages.

Eaton Corporation; Cleveland, Ohio; Circuit breaker motor operators, Local and remote switching capability; Publication No. PA01222022E/Z9314; Nov. 2009; 2 pages.

Cutler-Hammer, Westinghouse & Cutter-Hammer Products; Pittsburgh, PA Series® C Molded Case Circuit Breakers F-Frame 10-225 Amperes; Dimension Sheet 29-170F; Oct. 1997; 9 pages.

Description of Uninterruptable Power Supply (UPS) Installation; 2 pages.

* cited by examiner

| Current State | UIB | UPS | UPS Bypass | MIB | LBB | MBB | Input Power | Next State | UIB | UPS | UPS Bypass | MIB | LBB | MBB | Input Power |
|---|---|---|---|---|---|---|---|---|---|---|---|---|---|---|---|
| NORMAL | ON | ON | ON | ON | OFF | OFF | ON | MAINTENANCE BYPASS | ON | ON | OFF | OFF 3 | OFF | ON 2 | ON 1 |
| MAINTENANCE BYPASS | ON | ON | OFF | OFF | OFF | ON | ON | NORMAL | ON | ON | ON | ON | OFF | OFF 3 | ON 1 |
| MAINTENANCE BYPASS | ON | ON | OFF | OFF | OFF | ON | ON | MAINTENANCE BYPASS-UPS ISOLATED | OFF 2 | OFF 1 | OFF | OFF | OFF | ON | ON |
| NORMAL | ON | ON | ON | ON | OFF | OFF | ON | NORMAL ECO | ON | ON | ON 2 | ON 2 ON | OFF | OFF | ON 1 |
| NORMAL | ON | ON | ON | ON | OFF | OFF | ON | STANDBY | OFF 1 | ON | OFF | OFF | OFF | OFF 2 | OFF 2 |
| MAINTENANCE BYPASS | ON | ON | OFF | OFF | OFF | ON | ON | MAINTENANCE BYPASS-LOAD TEST ONLY | ON | ON | OFF | OFF | ON 3 | OFF | ON 1 |
| MAINTENANCE BYPASS-LOAD TEST ONLY | ON | ON | OFF | ON | ON | OFF | ON | MAINTENANCE BYPASS | ON | ON | OFF | OFF | OFF 2 | ON 3 | ON 1 |
| NORMAL | ON | ON | OFF | ON | OFF | OFF | ON | OFF | OFF 2 | OFF 4 | OFF ON 3 | OFF 5 | OFF | OFF 6 | OFF EITHER 1 |
| OFF | OFF | OFF | OFF | ON | OFF | OFF | OFF | NORMAL | ON 2 | ON 3 | ON OFF 4 | ON 5 | OFF | OFF | ON 1 |

FIG. 7

MAINTENANCE BYPASS ASSEMBLY FOR UNINTERRUPTABLE POWER SUPPLY

This application claims the benefit of priority to U.S. provisional application Ser. No. 62/859,402, "Maintenance Bypass Assembly For Uninterruptable Power Supply", filed on Jun. 10, 2019, which is incorporated herein by reference in its entirety.

TECHNICAL FIELD

This application relates to an apparatus and method of isolating an Uninterruptable Power Supply (UPS) from a power source and a load.

BACKGROUND

Modern electronic systems, such as those used in hospitals, data centers and other business applications depend on a continuous supply of well regulated and controlled prime power from a commercial power distribution system as even a momentary interruption in the energy supply can result in loss or corruption of data, injury to patients, damage to equipment, or other undesirable consequences.

An Uninterruptable Power Supply (UPS) may be used to ameliorate this problem, sometimes combined with an independent power source such as a back-up generator, alternative grid connection, or the like. A typical UPS comprises an AC-DC converter to convert the input power (sometimes called prime power, utility power, grid power, or similar terms as is known in the art) to a DC voltage used to charge a storage battery subsystem to store energy so that the stored energy may be used in the event that the input power is interrupted. The DC power bus also connects the battery subsystem to a DC-AC converter that, when connected to the load, provides a source of AC power for as long a time period as the energy supply of the battery permits. Where continuity of power is a requirement, the UPS is in an on-line condition where the input power flows through the AC-DC converter and the DC-AC inverter to the load, with the battery system in a fully-charged condition and connected to the DC bus of the UPS.

In an alternative configuration, the UPS has an internal static bypass path that connects the input and the output of the UPS so as to provide a direct path for the power from the input of the UPS to the output of the UPS. This configuration may be selected manually with a switch, or be enabled automatically using a "static bypass" comprising a back-to-back configuration of suitably rated thyristors. A combination of a thyristor-type static bypass with a bypass relay in parallel therewith may also be used so that the thyristors may only be active for a short period of time. Such a configuration is sometimes used to minimize the cooling requirements for the thyristors. The internal bypass circuit of the UPS is intended to ensure that input power is supplied to the load in the event of a component of the UPS fails or needs maintenance, necessitating that the uninterruptable path be disabled for a period of time.

When the internal bypass is selected, and any of the AC-DC converter, the DC-AC inverter or the battery system are rendered inoperative or otherwise unavailable, the uninterruptable capability of the UPS is compromised, as a failure of any aspect of the input power results in an interruption of the continuous energy supply to the load. Such a situation could occur during the maintenance or replacement of a subsystem of the UPS. When servicing or repairing the UPS, disconnecting the UPS from the input and the load may be desirable as a safety precaution. Since a function of a maintenance bypass assembly is to disconnect the input and the output terminals of the UPS from the external environment, the switchgear of the maintenance bypass assembly is located external to the UPS itself.

More complex arrangements of UPS modules are known and redundant configurations, configurations having alternative input power sources, such as the power grid and generators are possible using a plurality of suitably configured and coordinated UPS modules.

While a generic UPS functions as described herein, each manufacturer and model of the equipment may use somewhat different control protocols and have different capabilities of monitoring performance.

In order to facilitate repair or replacement of the UPS, a plurality of circuit breakers may be located in a Maintenance Bypass Assembly (MBA) and both the input power path and the output power path of the UPS pass through the MBA. The design of such an assembly for reconfiguring the power path should adhere to the highest standards of safe equipment design due to the hazards to personnel concomitant with the high-voltage and high-current capabilities of the overall energy supply system. Shock hazard and electrical flash-over are a significant concern; additionally, the multiple circuit breakers or switches must be activated in a prescribed order and dependent on conditions precedent in order to avoid unintended interruption of power to the load, compromise of personnel safety, or significant damage to the UPS, associated equipment, or the electrical load.

At present, two methods are commonly used to ensure the proper sequence of operation of the bypass circuit breakers, for safety and power availability and reliability reasons. In the first method, detailed written instructions are provided and the operator is depended upon to strictly follow the instructions. In this sense, a significant limitation of the written instructions is the requirement that the operator exercise diligence in following the prescribed sequence of actions and to verify any required conditions precedent to a circuit breaker actuation. Human error, lack of proper training, or complacency leads to mistakes in following the operating instructions resulting in significant equipment damage and hazard to personnel.

A second method is a "Keylock" system (or commonly referred to as "Kirk Key" Systems as a major supplier of the components is Kirk Key Interlock Company, N. Canton, Ohio), supplemented by written operating instructions. This system associates a set of keyed mechanical locks with each of the circuit breakers or electrical switches to be controlled so that a specific subset of the procedures in the instructions are enforced by the locks and keys. For example, the MBB (Maintenance Bypass Breaker) shall not be turned on in a system unless the UPS is in bypass mode. To enforce this procedure, a Solenoid Key Release Unit (SKRU) is installed. The SKRU of the MBA interfaces with the UPS where a sensing circuit indicates whether the UPS is in a bypass mode. This state may be indicated, for example, by an illuminated pushbutton on the MBA and when the pushbutton is actuated, a key maybe removed from the SKRU and that the same key used to unlock the MBB so that the MBB can be used to activate the bypass function of the MBB. However, this is only the first step in the process. Nothing prevents the MBB from being turned back off again, unless the MBB can also be locked in the off position. Typically, only one state of the circuit breaker can be locked (although a circuit breaker that is locked in an "on" position may be tripped by an overload condition). And, there are other actions to be taken subsequently. The output of the UPS needs to be disconnected from the load by opening (turning off) a MIB (Maintenance Isolation Breaker) and the UPS itself may need to be disconnected from the input power by a UIB (UPS Input Breaker) if the UPS is to be completely isolated from the input power. Opening the UIB prior to closing the MBB, for example, results in the interruption of the energy supply to the load if the UPS is in the bypass mode. Sensing that the UPS is not in the bypass mode may permit removal of a first key. A second key may be removed from a MBB lock and the two keys may be needed to open the UIB. Other such interlocking operations may be required, and a person of skill in the art would appreciate that the number of keys and the sequence of actuation of the keys soon becomes a challenge for the operator. Moreover, as the number of conditions that are supervised by the key locks increases, the number of keys and the reasons for operating the keys and circuit breakers tends to confound the intuition of the operator, making adherence to the procedures both more essential and more tedious.

Another example of this problem is that, to avoid output conflict of the UPS output and the input power during maintenance bypass mode, the MIB may be turned off and locked. The key from MIB lock may be inserted into the SKRU and held captive so that MIB cannot be turned on unless the UPS is in bypass mode. A key from the MIB lock may be removed to permit the MBB to be engaged. Paradoxically, the key lock would not prevent opening the MBB and interrupting the power to the load when the UPS is not available. Not all unfavorable or dangerous state changes can be reasonably or reliably accommodated by the key-lock system.

Although key-lock systems are an improvement when compared with merely providing written instructions, they have evident shortcomings. Using the example above, the SKRU may ensure that the UPS is in the bypass mode before the MBB is turned on and the MIB turned off. But once the UPS is in a bypass mode and the key is removed from the SKRU, there is no provision to prohibit the UPS from being placed online. If both the MBB and the MIB are turned on and the UPS goes online, the output of the UPS and the utility power may not have the same phase or phase rotation or may feed input power into the output of the DC-AC inverter of the UPS. The conflict of the output and feedback voltages may result in significant damage to components of the UPS, the load, or the utility input power system and may cause other protective devices to actuate. This may cause at least momentary loss of power to the load, which obviates one of the essential functions of the UPS.

In summary, key-lock systems are typically capable of locking the circuit breakers in an off position, or an on position, but not both positions. This may be desirable from a safety viewpoint, but does nothing to prevent inadvertent turn off of the MIB when in a normal operating state or turning off the MBB in the maintenance bypass mode and thus interrupting the flow of energy to the equipment.

SUMMARY

An electronic assembly is disclosed comprising an interface configured to accept alternating current (AC) power from an external source which may be utility power, a back-up generator or the like having an first interface for connection to an electrical load; a second interface connectable to an Uninterruptable Power Supply (UPS) AC power input; and a third interface connectable to the UPS AC power output. A plurality of electrically actuated circuit breakers or contactors are controlled by a digital processor configured to sense the status of MBA and the UPS and to accept user commands for reconfiguring the power flow between the input and the output interfaces.

In an aspect, the MBA may have a graphical display showing the system status and permitted state changes from the present operating state and the control processor is responsive to operator command inputs to change the state of the combination of the MBA and UPS while preventing state changes that may result in damage to the MBA, the UPS or the load.

In another aspect, the MBA may be configured to convey power from the UPS to the load, to provide power to a test load, or to isolate the UPS from the power source and the load so that the UPS may be serviced while maintaining continuous power to the load from a source of input power during the servicing of the UPS.

A method of managing the connection of a UPS configured to supply uninterruptable power to an electrical load is disclosed, where the UPS may be safely disconnected from the prime power source and the load so that the UPS may be maintained or replaced, the method comprising: providing a maintenance bypass assembly (MBA) having an interface to a source of prime power and an interface to an electrical load, the maintenance bypass assembly further comprising:
  an interface connectable to the input of the UPS to provide prime power to the UPS;
  an interface configured to be connectable to a load so as to provide power from the UPS to the electrical load;
  a plurality of remotely controlled electrical circuit breakers;
  a processor including volatile and non-volatile memory and an interactive display, the processor configured to control the plurality of remotely controlled electrical circuit breakers;
the method further comprising:
  determining, by the processor, a current state of the configuration of the electrical circuit breakers;
  displaying, by an electronic display, a current state of the MBA corresponding to the current state of the configuration of the electrical circuit breakers;
  displaying one or more permitted next states of the MBA;
  selecting a next state of the MBA selected from the permitted next states of the MBA responsive to an operator input; and
  controlling the electrical circuit breakers by the processor to alter the connections within the MBA in an allowed sequence of operations so as to place the MBA into the next state.

In another aspect, a computer program product is described comprising computer readable instructions stored in a non-volatile electrical memory that, when executed by a processor of a maintenance bypass assembly (MBA) having electrically controllable circuit breakers, is configured to perform the steps of:
  determining a present state of the MBA;
  determining and displaying allowable next states of the MBA;
  responsive to an operator input to the MBA, controlling the circuit breakers of the MBA to transition the MBA to a next state, selected from the displayed allowable next states; and
  confirming that the selected next state is has become the current state.

BRIEF DESCRIPTION OF THE DRAWINGS

FIG. 7 is a tabular representation of examples of examples of state transitions that may be programmed for control of an example deployment of an MBA with a UPS.

DESCRIPTION

Exemplary embodiments may be better understood with reference to the drawings, but these examples are not intended to be of a limiting nature. Like numbered elements in the same or different drawings perform equivalent functions. When a specific feature, structure, or characteristic is described in connection with an example, it will be understood that one skilled in the art may effect such feature, structure, or characteristic in connection with other examples, whether or not explicitly stated herein.

A highly-reliable power supply system for electrical equipment may incorporate an Uninterruptable Power Supply (UPS) and a Maintenance Bypass Assembly (MBA). UPS systems are available from a number of commercial sources and vary in capacity and function. Some known manufacturers of UPS are Mitsubishi, Toshiba, Liebert, APC and MGE and some known manufacturers of MBAs are C&C Power and Triplite.

Figure 1:
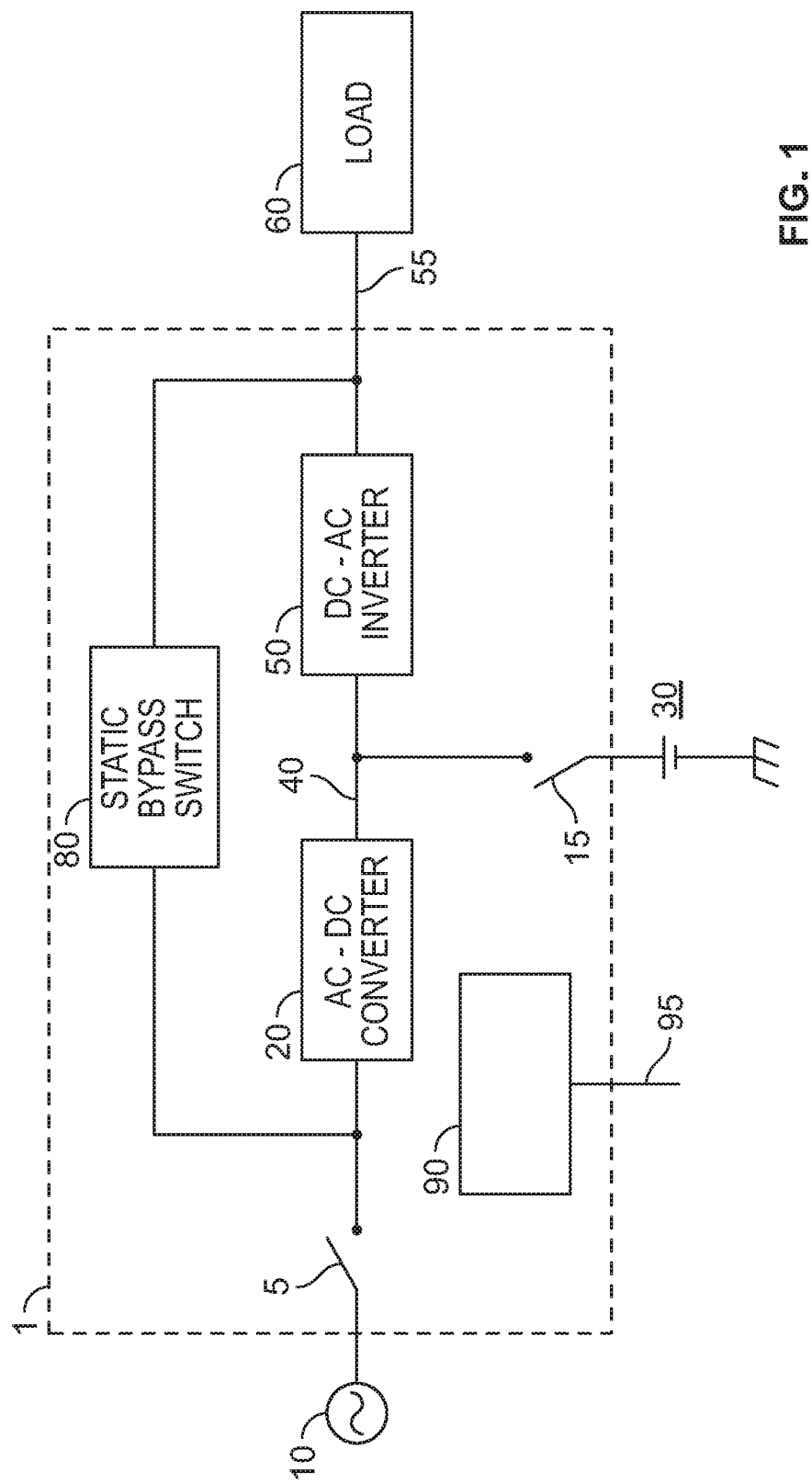
FIG. 1 is a functional block diagram of an example of an Uninterruptable Power Supply (UPS) which may be used in conjunction with a Maintenance Bypass Assembly (MBA)

A simplified block diagram of the main electrical aspects of a UPS system 1 is shown in FIG. 1 as a single-line power-flow diagram, where the input from a commercial power source 10, or local source of equivalent characteristics, is connected through to an input of an AC-DC converter 20 for charging a storage battery system 30 on a DC bus 40 that also connects to an input of a DC-AC inverter 50 so as to provide an AC energy source output of controlled frequency and voltage appropriate for the load 60 which may be, for example, computer equipment of a cloud data center, or the like. The storage battery system 30 may be integral to the UPS or be housed in separate enclosures due to the size and weight of typical back-up storage batteries. Such storage batteries are commonly lead-acid storage batteries, however other storage battery technologies are being developed, such as lithium-ion batteries, and may be used when they become economic.

Typically, an external input circuit breaker or switch 5 serves to disconnect the UPS 1 from the input power 10 when the UPS 1 is not in use or is being maintained. Similarly, the storage battery subsystem 30 may be isolated by a circuit breaker or a switch 15, which may be a relay, a contactor or other device performing an equivalent function and which may be locally or remotely controlled. A control and status interface 90 may provide status indicators that may read by, or to communicate with, or accept commands from other equipment having compatible characteristics through an interface 95, which may be one or more of any known analog or digital interfaces such as contact closures, an Ethernet connection, a wireless connection or any other such interface performing a same or similar function. The control and status interface 90 may also accept input from manual push buttons on the UPS or from soft keys on a graphical display so as to manage local functions of the UPS such as enabling the bypass mode, disconnecting the storage batteries or turning the entire UPS off.

The AC-DC converter 20 provides the power needed to re-charge or trickle charge the storage batteries 30, which may continue to be connected to the DC-AC invertor 50. A static bypass switch 80 of UPS 1 may provide an alternate path through the UPS 1 that is either automatically enabled when the output of the AC-DC converter 20 or DC-AC inverter 50 is faulty, or the storage battery 30 is depleted.

In the examples herein, the input frequency, phase and voltage of the UPS 1 is assumed to be nominally equal to the output frequency, phase and voltage. More complex systems may have voltage conversion or frequency conversion. In such cases auxiliary equipment such as transformers may be included, as well as a back-up UPS, a standby generator or the like. The disclosed embodiments herein will provide sufficient detail so that a person of skill in the art can apply the concepts to such more complex environments.

The UPS 1 may be powered by the external energy source 10, which may be a utility grid, a motor generator set or the like, which is ordinarily thought of as a highly reliable source of power, but one whose reliability or availability does not meet the requirements of the specified load 60, which may be identified in a service level agreement. The UPS 1 is used to supply power from the battery subsystem as a temporary source of stored energy when the utility power 10 is temporarily unavailable.

A manually-operated Maintenance Bypass Assembly (MBA) is a configuration of circuit breakers, cables, and connectors that permit the user to connect the load 60 directly to the utility power 10 and to permit repair or periodic maintenance of the UPS 1. Such a manual system may consist of three major circuit breakers:

MBB—Maintenance Bypass Breaker
UIB—UPS Input Breaker
MIB—Maintenance Isolation Breaker Where testing of the UPS under a power load is desired, there may also be a Load Bank Breaker (LBB) to connect a load bank to the UPS output. The load bank may be a non-inductive resistive load, capable of dissipating a predetermined power. The load bank may be either a component of the UPS or a separate device. This load bank could be used for verifying a repair or adjustment, or for testing the status and performance of the storage battery subsystem. In addition, where the system design includes alternative sources of prime power such as a prime-mover-generator set or an alternate grid connection, there may be additional input switches and controls, including additional power paths within the MBA or the UPS.

Commonly, manually-activated circuit breakers or contactors are used as switches to make or break connections in the wiring path of the MBA. The circuit breakers can also function as overload protection and are preferably sized to minimize disruption of system operation, damage to connected equipment and to preserve the energy supply to at least portions of the load in the event of a fault. When spontaneous actuation of a circuit breaker occurs, usually due to an overload or other transient event, a careful technical analysis of the cause of the actuation ("trip") is needed so as to rectify the fault. This may include verification of the operation of component of the UPS or identification of the transient event or the location of the overload or failed equipment. It is not uncommon in such situations for personnel to be confused, flustered and to exhibit symptoms of time pressure to return the system to full operation, as such an event constitutes a major failure viewed from a management perspective. This is particularly true of UPS use in modern data centers and related computer-operated devices, where the loss of functionality can be costly in view of contractual service guarantees. Rapidly restoring power to the serviced equipment is highly desirable, provided that it can be performed without risk of further damage to the UPS or the serviced load.

A spontaneously-tripped state of a circuit breaker in the MBA/UPS system is not a normal occurrence and the sequence of operations and the conditions precedent to resetting a tripped circuit breaker may be quite unfamiliar to personnel accustomed to performing routine maintenance and repair. This considerably exacerbates the emergency situation, potentially leading to an incorrect configuration of the reset circuit breakers and further damage or outage.

Existing manually-operated MBA products attempt to minimize incorrect operation of the MBA/UPS combination by detailed written procedures and Kirk-Key-type interlocks, as previously described. But, such manually operated products suffer from the disadvantages previously described.

Figure 2A:
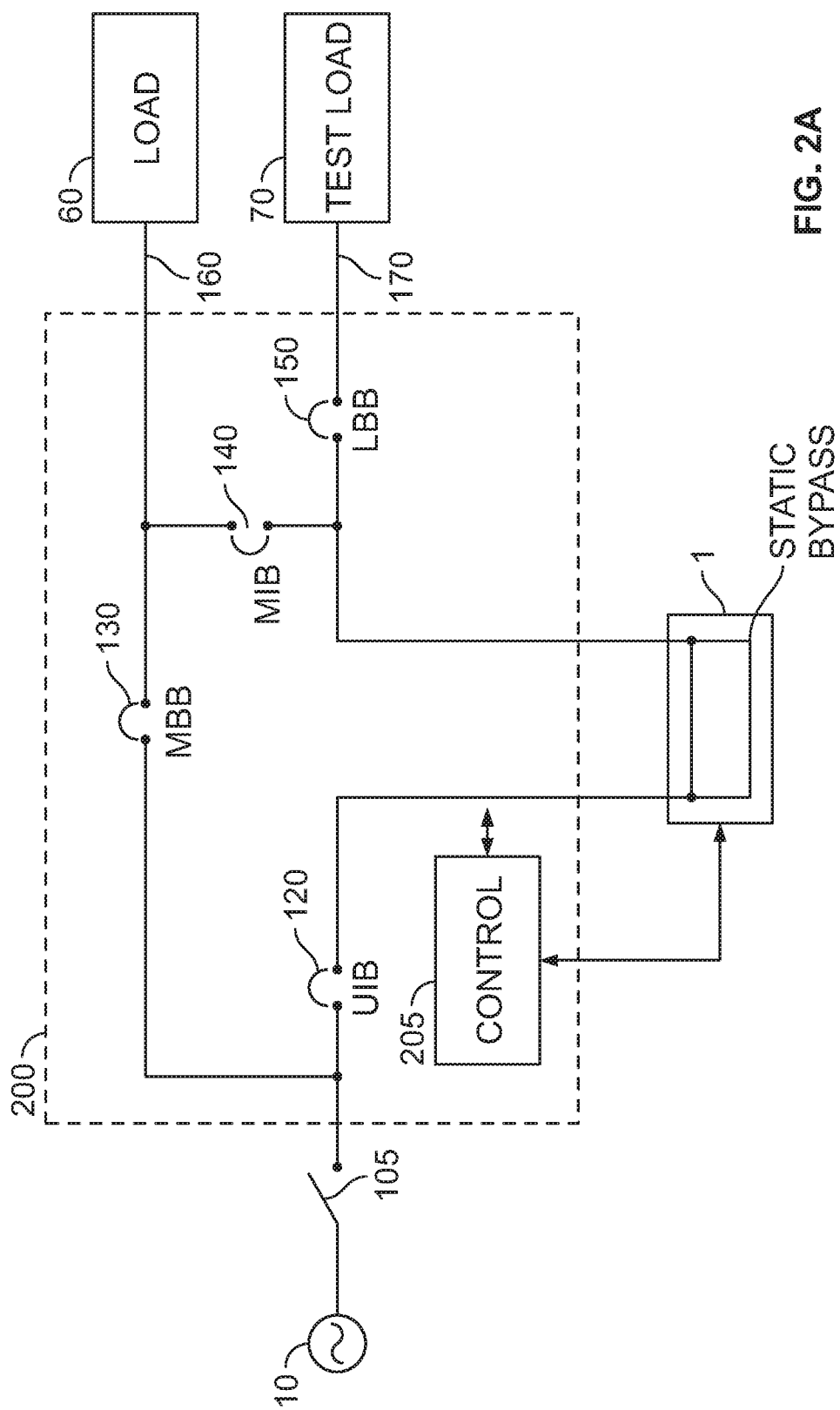
FIG. 2A is a functional block diagram of an example of a Maintenance Bypass Assembly (MBA) interfaced with a UPS.

FIG. 2A shows a configuration diagram of an improved MBA/UPS combination in an un-energized state. The UPS 1 may be a separate enclosure (shown here as including the storage battery subsystem 30 of FIG. 1) that is interconnected with the MBA 200 such that the utility power or other source of energy 10 is an input to the MBA 200 and an output 160 of the MBA 200 supplies either power derived from the input power 10 by the UPS 1, or power derived from the input power 10 that traverses the MBA 200 without being managed by the UPS 1. Another power output 170 may be available for use with an external test load 70. At least the UIB 120, the MIB 140 and the MBB 130 of this configuration can be remotely-controlled circuit breakers or electrical contactors. The design of UPS 1 may require the static bypass switch 80 be in the ON (bypass) state when input power first appears at the output terminal 55 of the UPS 1, such as when the MBB 130 is closed prior to opening the MIB 140, to prevent damage to the DC-AC inverter 50 of the UPS 1.

The possible power paths are shown as single-line electrical schematics, where the single-line may represent a single-phase circuit, a three-phase circuit, a DC circuit, or the like, with corresponding multiple-line circuit breakers, contactors, or other control and monitoring components as needed. Other input configurations are possible, including an input from a separate power source, which may be another utility feeder line, a back-up generator system or the like, for further reliability. Where such alternate sources are used, the phase alignment between the UPS and the alternative source should be monitored or controlled to prevent system damage.

In ordinary operation, the MBA/UPS combination is in one of two states:
1. Normal Operation Mode
2. Maintenance Bypass Mode Each of these states may have sub-states or alternative configurations. Specific fault conditions may be identified as additional states.

Figure 2B:
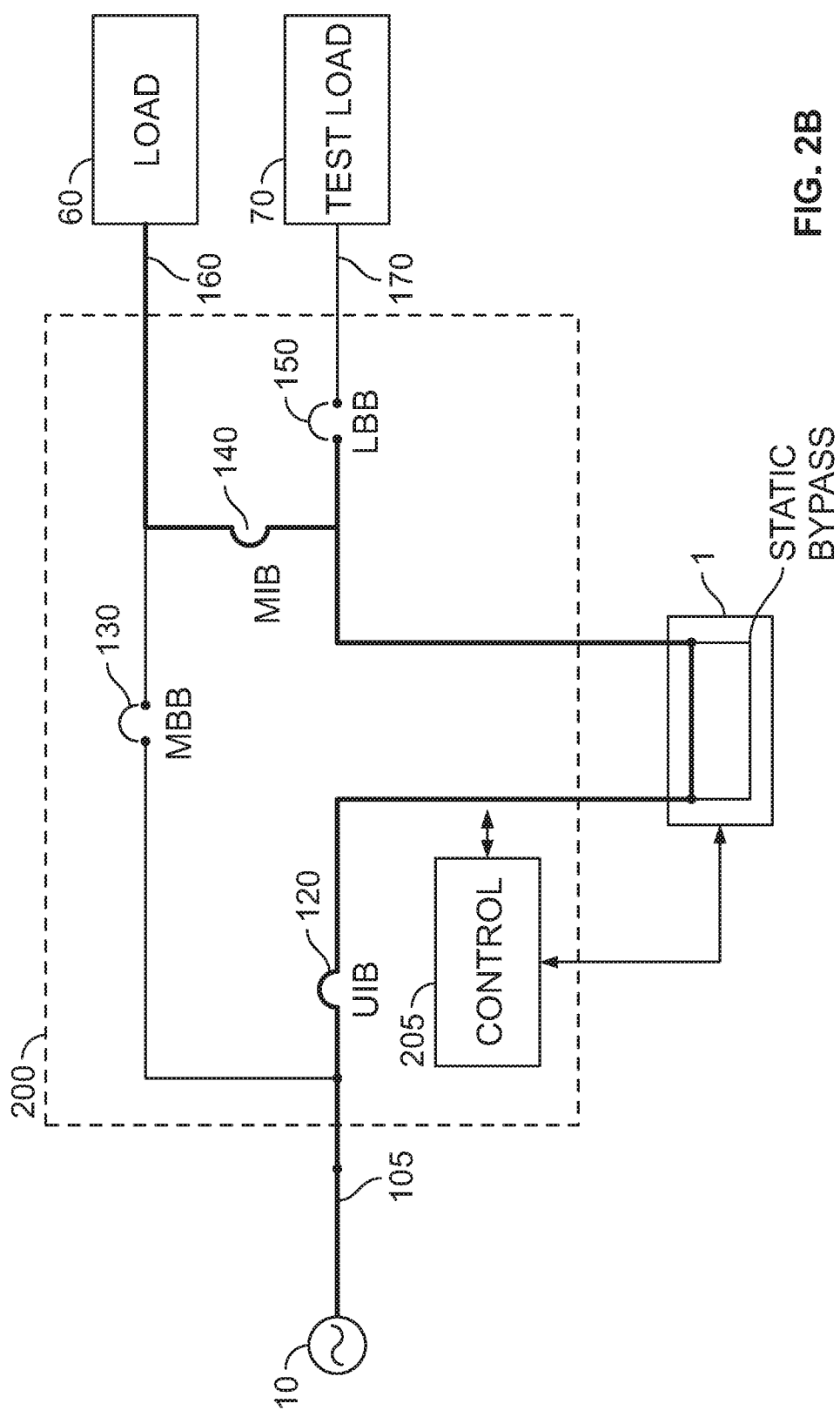
FIG. 2B shows the MBA of FIG. 2A configured to provide prime power through the UPS to a load.
Figure 4:
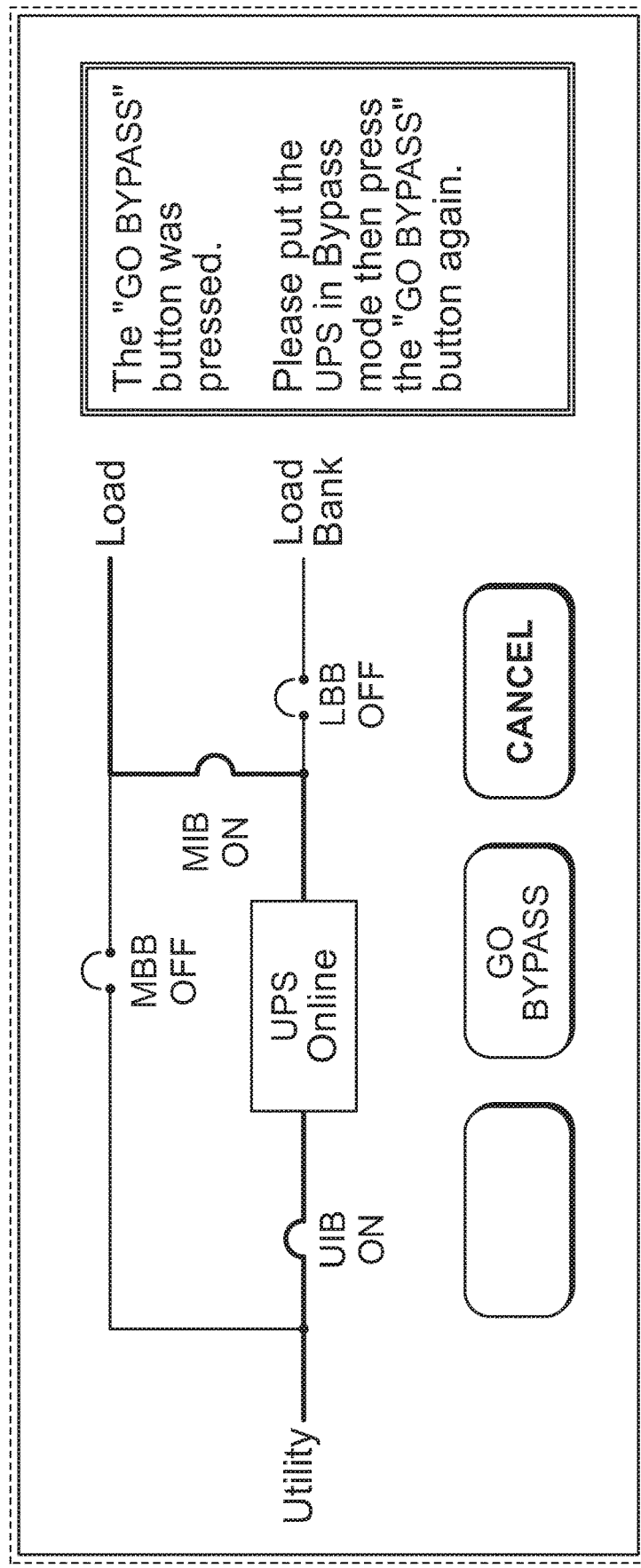
FIG. 4 is a representation of the graphic display of the MBA showing the MBA and UPS status, soft keys for controlling the operation, and information for the operator.

FIG. 2B shows the flow of power in the MBA/UPS combination in the Normal Operation mode. The single-line diagram is broadened when showing the path or paths through the system that are energized in the Normal Operation mode. In Normal Operation switch 105 is closed, the UIB 120 is closed to supply input power 10 to the UPS 1 from the utility or other external source, the UPS 1 is on-line in with the static bypass 80 off; and, the MIB 140 is closed to supply power to the load 60 from the UPS 1. In this configuration, failure of the input power 10 does not result in an interruption of the power supplied at output 160 to the load 60 as the stored energy in the storage batteries 30 is used as an input to the DC-AC converter 50 instead of the output of the AC-DC converter 30 as both of the sources of energy are present on the DC bus 40 of the UPS 1. The status of the MBA may be conveyed to an operator for monitoring and control. These functions may be performed remotely through the usual communications mechanisms. FIG. 4 shows an example of a graphical display representation of the configuration of the MBA along with soft keys and an instruction region. The display provides for possible mode changes using the soft keys. For simplicity, the possible mode change available, taking account of the current configuration status, is to change from the Normal mode to the Maintenance Bypass mode. However, in order to execute this state change, the bypass switch 80 of the UPS 1 needs to be on the ON or bypass state so as to avoid a power interruption at the load 60. For illustrative purposes, it is presumed that the MBA has sensed that the bypass switch 80 was in the OFF position and needs to be placed on the ON position manually prior to proceeding further. An instruction to do this manually is posted on the graphical display and the automated process is paused until the operator places the UPS in the bypass mode and pushes the soft key on the graphical display a second time. Depending on the design of the UPS 1 performance of the step may be remotely sensed by the MBA 200. Alternatively, if the UPS bypass switch 80 is capable of being remotely controlled, the status change may be remotely commanded by the MBA. After completion of the described programmed operations the MBA/UPS combination will be supplying power to the load 60, but the resultant configuration does not have a backup capability in case of a prime power interruption as the UPS 1 has been bypassed by action of the circuit breakers.

Figure 2C:
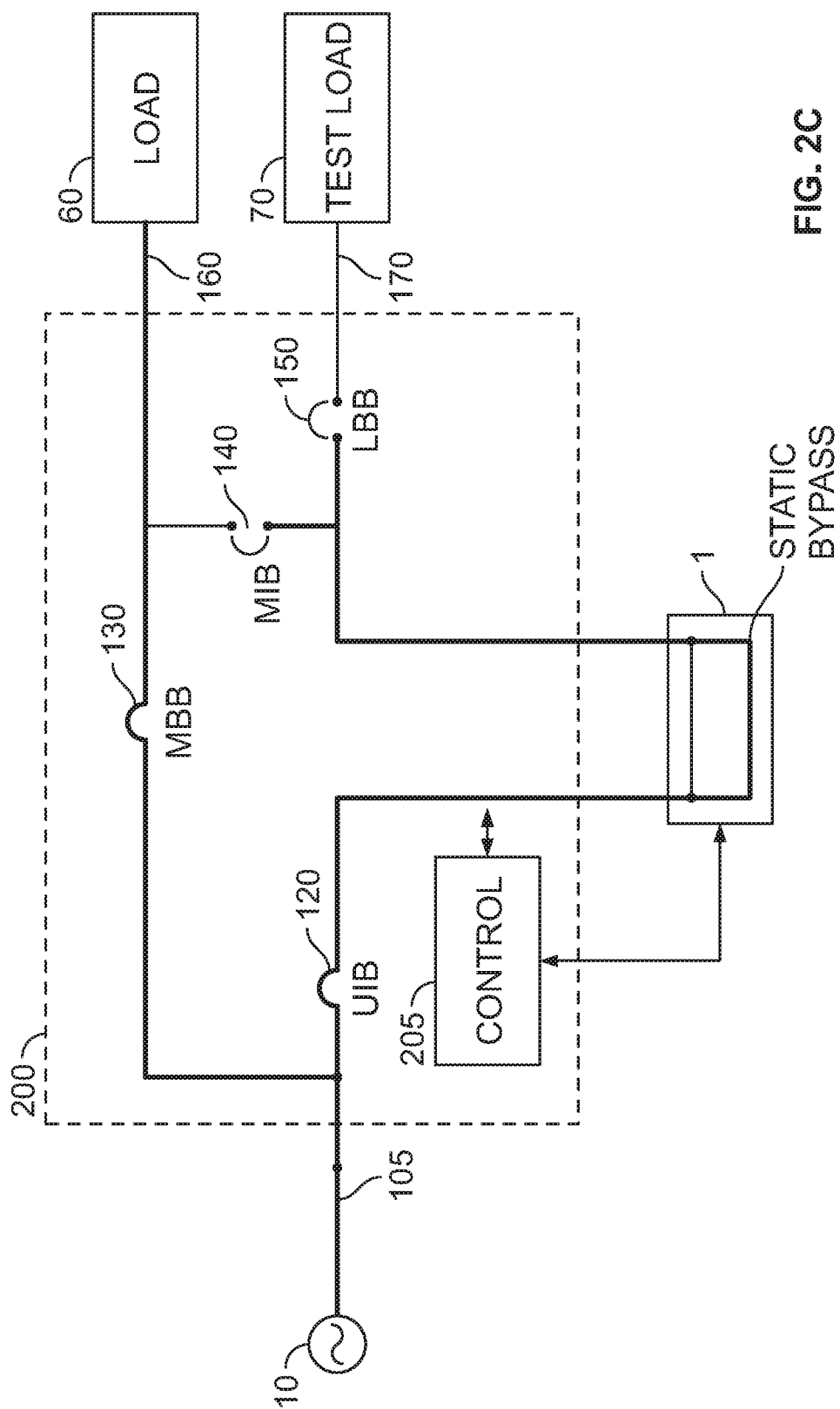
FIG. 2C shows the MBA of FIG. 2A configured to supply prime power directly to the load while the UPS is being trickle charged.

FIG. 2C shows the MBA 200 in Maintenance Bypass mode where the MBB 130 is closed to supply power to the load 60 directly from the power input 10 and the MIB 140 is open to isolate UPS 1 from the load 60 so that maintenance of the UPS 1 may be performed without affecting the supply of power to the load 60. The UPS 1 is shown in the static bypass mode with the static bypass switch 80 closed. In this state, the batteries may still be trickle charged, but the UPS 1 does not supply power to the load 60.

Figure 2D:
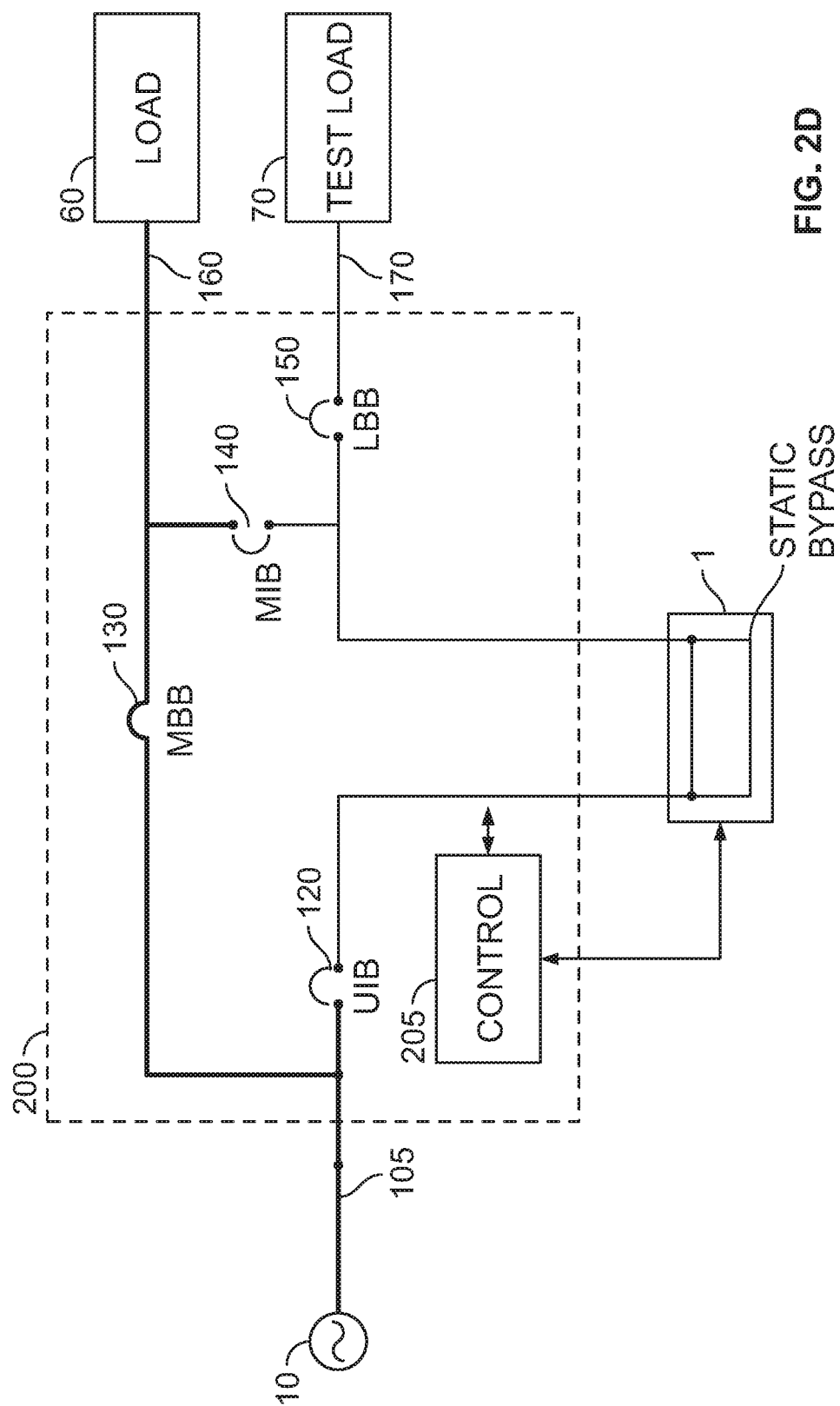
FIG. 2D shows the MBA of FIG. 2A configured to supply prime power to the directly to the load and the UPS is isolated from the prime power and the load.

FIG. 2D shows a representation of the MBA/UPS combination in the Maintenance Bypass where the UIB 120 has been opened so that the UPS 1 is now completely isolated from the input power 10. Complete deactivation of the UPS 1 would may include isolation of the storage batteries 30 from the DC bus 40, and whether this may be accomplished remotely or the step needs to be performed locally at the UPS 1 depends on the capabilities of the particular UPS system used. In this state, the components of each subsystem of the UPS 1, or the entire UPS 1 may be repaired or replaced as an integral unit, with or without the battery subsystem 30, depending on the system design.

There can be a state in which the UPS 1 is active, the static bypass 80 is open and the LBB 150 has been closed so that the UPS 1 can supply power to the test load 70 through an auxiliary output 170. The MBA 200 may be in the Maintenance Bypass mode so that the load 60 is continually supplied with power through the output 160, albeit without a backup in case of prime power failure. If the UIB 120 is open, the power to the test load 70 is being supplied from the energy in the storage batteries 30 through the DC-AC inverter 50. Each of the states described is a non-limiting example of a valid operating condition or state when there is no failure in the MBA/UPS system, and one may desire to transition between any of these states to enable maintenance or testing of the associated UPS. Other configurations are possible and are not excluded by describing particular examples.

When switching the MBA/UPS system between valid operating modes, the MBA circuit breakers need to be turned on or off in a specific sequence, taking account of the pre-existing state of the MBA/UPS combination. The pre-existing state may include, for example, the operational status of the UPS (e.g., on-line, bypass mode, off-line, component or subsystem failure), the presence of power at the input to the MBA, and the configuration of the circuit breakers and contactors or switches. This status may include whether a circuit breaker has been tripped due to an overload and whether it is open (OFF) or closed (ON) as the normal condition for the intended system operating state. A controlled sequencing of circuit breakers when changing state is needed to avoid conflict between the UPS output power and the utility power supply at the load and to ensure that power continues to be supplied to the load during and after the transitions in state, where such a requirement exists.

Even with aid of a key-lock system, proper operation of a manual MBA/UPS combination relies on the operator to faithfully follow the written procedures for both the MBA and the UPS and use of the plurality of keys to operate the locks. A single mistake in the sequence of operation may cause the load to lose the power or cause damage the equipment. The situation is considerably more complex if there is a failure that results on tripping one or more of the circuit breakers.

The system of FIGS. 2A-2D is intended to minimize or eliminate the prospect of operator error in configuring the MBA/UPS combination by embodying rules for change of state and recovery from failure in a process that uses a stored program in microcontroller, combined with voltage and current sensors and the sensed status of the circuit breakers of the MBA and the UPS or other sensed states such as, for example, the status of bypass switch 80 in the UPS 1 to perform steps of the procedure without permitting manual user action to change the state of circuit breakers and to guide the user to carry out other steps which may be optional, in an safe manner. Herein, we describe a few simple examples that illustrate the system and method.

As mentioned, in a manual system, it would be possible for a user to unintentionally or inadvertently actuate a manual circuit breaker that would result in the damage or power interruption that has been described. Consequently, the MBA uses motorized circuit breakers or contactors for all circuit switching functions whose operation needs to be strictly controlled. (The use of the term "motorized" is not intended to restrict the type of circuit breaker and circuit breakers, contactors or switches operated by solenoids, motors or other remotely-controllable electrical means may be used equivalently.) Whether a circuit breaker or a contactor is used to perform the switching operation may be dependent on the specific system design and function to be performed. While the motorized breakers may be accessed for servicing or in a system failure mode, they may be concealed within an equipment enclosure so that they are not normally accessible to the operator performing maintenance of the UPS. The equipment enclosure may be lockable so that access to portions of the MBA that are not required for routine operation of the MBA are denied to the operator. That is, while the function of the disclosed MBA is to use remotely controllable circuit breakers (typically located internal to the MBA assembly) to configure or reconfigure the supply of energy to the load so that the UPS may be repaired, serviced or replaced, a situation requiring the repair, servicing or replacement of the MBA is an entirely different matter having different safety issues and maintenance procedures. Nothing herein should be interpreted to require the various remotely-controlled circuit breakers or other components to be in a same enclosure as an advantage in some circumstances of the remote control is that the circuit breaker may be located close to each point of power management so as to optimize power cable lengths.

The MBA is intended to isolate the operator from the individual circuit breakers used to change the state of the MBA both to prevent the operator from manually intervening in the operation as well as to protect personnel against any arc-flash hazard. This does not exclude the provision of an emergency shut-down switch or circuit breaker on the exterior of the MBA, or other such safety feature.

Motorized circuit breakers may be used for relatively low-power lighting control (e.g. groups of fluorescent lights in an office area) in commercial or industrial operations. At the opposite end of the power-control spectrum motorized breakers may be used in very-high-power installations where arc flash is a significant danger to personnel. These use cases often involve remote actuation of individual circuit breakers to control single circuits (or to simultaneously switch 3-phase circuits).

Some types of circuit breakers may require manual reset while others may be reset remotely if they have been tripped by an overload. Remotely resettable circuit breakers may be employed so that the operator does not have to directly access the circuit breakers at any time. When using a remotely resettable breaker, a breaker type including a status switch, which may be integral to or interconnected with the breaker may be used. In an example, tripping a circuit breaker may be sensed by associated auxiliary contacts, and an associated contactor in series with the circuit breaker may be caused to open the circuit. Once the fault in the overall system had been diagnosed and rectified, the circuit breaker or contactor may be manually or automatically reset. Under the condition that the auxiliary contacts indicate that the circuit breaker has been reset, the MBA may proceed to control other circuit breakers to enable entry into an appropriate operating state. The resetting of a circuit breaker is considered a change of state of the system and the appropriate control of the MBA and UPS when making a change such as re-setting a circuit breaker is subject to the same type constraints as will be described for normal operating modes.

Motorized circuit breakers suitable for the applications described herein may be configured, for example, using a manual circuit breaker of appropriate rating available from numerous manufactures such as Eaton and Schneider Electric, which may have auxiliary contacts for indicating the status of the circuit breaker in conjunction with a motor-operated actuator such as an Eaton MOPFD120C (Cutler Hammer brand, available from multiple distributors, including Widespread, Anaheim, Calif.) motor operator or other similar product that is compatible with the selected circuit breaker for each design. Such an assembly would be typically called a remote-controlled circuit breaker, a motorized circuit breaker or similar terminology. Sensing of the status of the circuit breaker may be performed by auxiliary contacts on the circuit breaker, or confirmed by monitoring other current or voltage sensors configured as part of the MBA.

Figure 3:
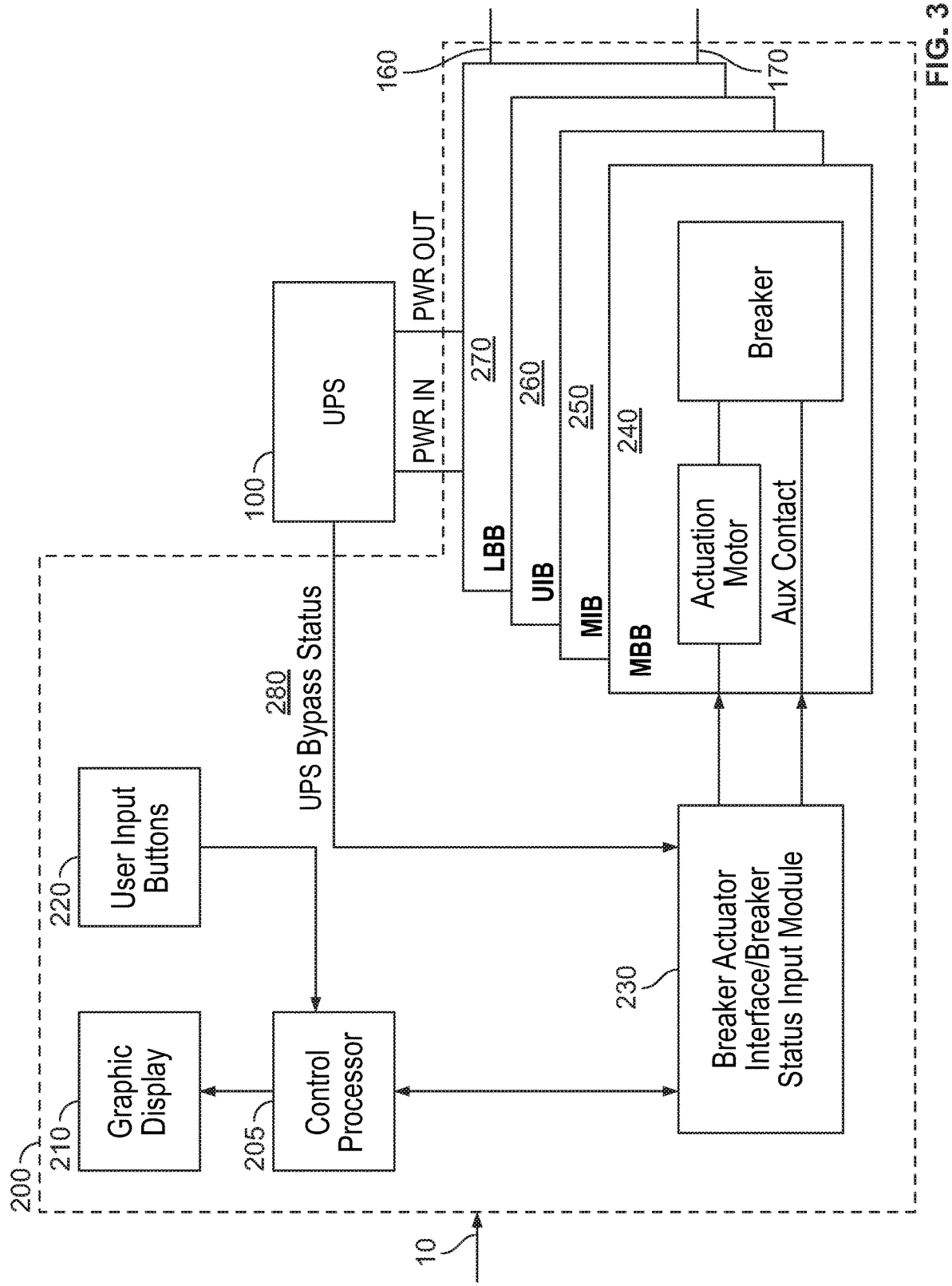
FIG. 3 shows an example MBA of FIG. 2A illustrating the control, monitoring and display functions.

FIG. 3 is a functional block diagram of the MBA 200. The assembly comprises a processor 205 having both volatile and non-volatile computer readable memories for storing an executable version of a machine-readable computer program product and temporary data and having interfaces to a graphical panel display 210 and optional user-actuated input buttons 220. Some or all of the user inputs may be received through the display 210 if the graphical display 210 has a touch-sensitive surface. The processor 205 may operate to sense the status of the circuit breakers, the contactors and other measureable aspects of the system, such as voltage, phase, current and the state of associated equipment such as the UPS 1, through an interface module 230, although some or all of these functions may be performed by the processor 205 using discrete digital inputs or an analog-digital converter (ADC).

Either the processor 205 or an interface module 230 may also control the operation of the remotely actuated switches or circuit breakers such as 240, 250, 260, 270. The MBA 200 connects to the UPS 1 for the power paths and also connects to the UPS 1 by a signal line 280 to sense or control the state of the UPS 1. In particular, a state of the UPS 1 of "normal" or "bypass" is determined from the signal line 280, where "normal" may be described as a state of the UPS 1 where the input power received from the MBA 200 flows through the AC-DC converter 20, the DC bus 40 and the DC-AC converter 50 to the output interface 160 between the UPS 1 and the load 60, the storage battery 30 is connected to the DC bus 40. and the state of "bypass" is a UPS state where the where the power input received through the UIB 120 flows through the static bypass 80 of the UPS 1 to the output interface between the UPS 1 and the MBA 200.

"Remotely actuated" as used herein, should be understood to mean that a control input to the component is capable of changing the state of the component from a closed-circuit condition to an open-circuit condition, or the reverse operation, to reset a circuit breaker, if such capability has been provided, and to sense the state (e.g. on, off, tripped) of the component. Typically, the control input to the component is a low DC voltage which may be a set level, am AC voltage, or a pulsed voltage, and the sensing of state is may be through auxiliary contacts on the component, optical sensors, current, phase or voltage sensors, magnetic position sensors, or the like and networked connections or wireless links may also be used.

FIG. 4 is a representation of the graphical display 210 for operator information and control showing the present states of the circuit breakers of the MBA 200 and the UPS 1 when the operator is in the process of transitioning from a state where the UPS 1 is on-line and providing continuous power to the load 60 (Normal mode) to a state where the UPS 1 will be bypassed so that the UPS 1 may be serviced (Maintenance Bypass mode). The condition shown is that the operator has initiated the state change and the next step needs manual intervention as the particular UPS 1, in the example configuration, is not capable of remote control or sensing of the static bypass 80 status. The broad portion of the one-line diagram indicates the present state of power flow in the system, and the state of the various circuit breakers may be visually displayed.

The display presents the only choices of actions, in this scenario that are permitted for the operator to perform when changing state from the Normal Mode to the Maintenance Bypass mode for the particular product configuration. In this example, operator action putting the UPS 1 into the bypass mode would be manually initiated at the UPS 1 and the change in state of the UPS 1 is sensed over the signal line 280 connecting the MBA 200 and the UPS 1. When the state of "bypass" is enabled, the displayed information changes so that the "go bypass" soft key is again illuminated. The operator presses the "go bypass" button again, and the MBA 200 enters the Maintenance Bypass mode as shown in FIG. 5.

Figure 5:
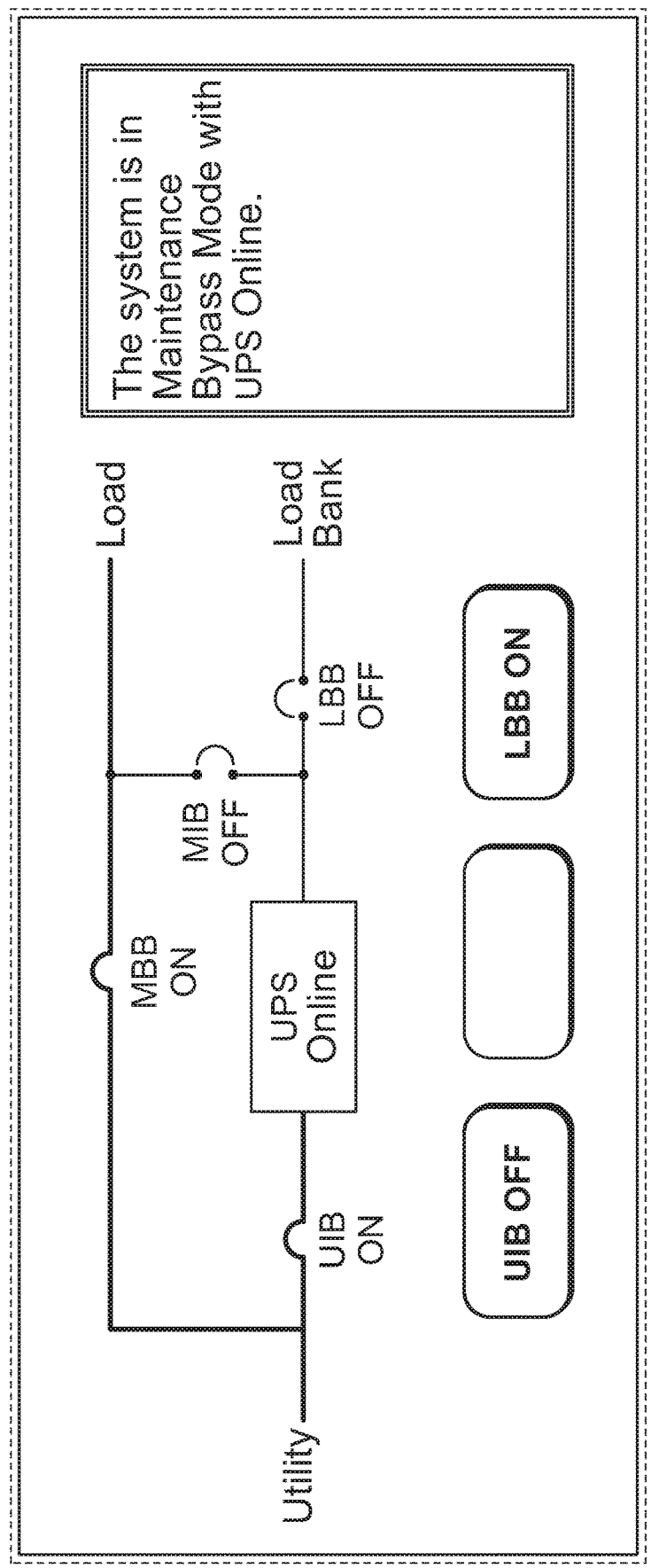
FIG. 5 is a representation of the graphic display of the MBA showing the status of the MBA and the UPS where the UPS is online, but the power is being supplied directly to the load from the utility.

The broad line in the one-line diagram of FIG. 5 shows that the power now flows through the MBB 130 to the load 60 in the Maintenance Bypass mode. In this state, the UPS 1 no longer provides continuous backup power and a loss of utility power would result in an interruption of power to the load 60. Note that in FIG. 4, the power flow line had confirmed that utility power was present. This may have been determined by one of the voltage sensors that may be used at various locations in the MBA 200, but are not shown in the visualization diagram. Alerting graphics may be incorporated that show the locations in the overall system where power voltages are present in each state. As a consequence of the programming of the state change criteria, if utility power was not present, the capability of a state change from Normal mode to Maintenance Bypass mode would be not be available to the operator.

If the display of FIG. 4 had showed that the power from the utility was absent (due to a power failure, for example) and that the power was being maintained by the UPS 1 using the stored energy in the storage battery to bridge the outage, the transition from the state of FIG. 4 to the state of FIG. 5 would not have been executed and an informational error message may be displayed. Since changes in state of the MBA/UPS may involve sequential actions, preconditions that need to be satisfied prior to starting the change in state need to be satisfied, particularly if there are still some manual steps in the process due to particular characteristics of the UPS being used. The steps of the process may be performed in a predetermined sequence that includes verifying the changes in state of the various circuit breakers prior to proceeding with another action in the state transition process. The time interval between each step of a state transition may be predetermined, or depend on the quantities sensed. Where there are no manual steps in the process, a failure to complete may be accommodated by reversing the steps to return to the starting state.

FIG. 5 shows the state change as successfully completed such that the input power flows from the utility power source or other external source such as a generator, to the load 60 through the MBB 130. In this state the UPS 1 is still "on-line" as it remains connected to the utility input power through the UIB 120, but the output of the UPS 1 is disconnected from the load 60 by opening the MIB 140. This state may be used to maintain the storage batteries in a fully-charged state by trickle charging and for some types of testing using the test load 70. The displayed information changes so that the options available to the operator are displayed using the virtual push buttons and supplemented by instructions on the display. In order to return to the normal operating state, the UPS may be put into the internal bypass mode which, when detected by the control unit may, for example, display a soft key on the display or enable a switch that when actuated, returns the MBA to the normal operating state.

In FIG. 5, the options available to the operator are to disconnect the UPS 1 from the utility power by opening the UIB 120 (UIB OFF) or to connect the output of the UPS 1 to the test load 70 by closing the LBB 150 (LBB ON). Note that this latter state may present a power load to the utility of up to twice the normal load if the test load is equal to the operational load. Depending on the sizing of the main circuit breaker external to the MBA and the capability of the utility, such a high input power demand may not be desirable. In such a circumstance, the state transition may not be permitted, and the operator may be prompted to select UIB OFF before proceeding with connecting to a test load.

Continuing further, the operator may isolate the UPS 1 by selecting UIB OFF and the display would no longer show a broad line to the input of the UPS 1. In an aspect, for safety reasons, the UPS 1 may need to be placed in an off-line mode prior to any servicing action. This could include manually opening a circuit breaker of the UPS at the input to the UPS 1 or manually opening a circuit breaker between the storage batteries and the DC bus 40, depending on the subsystem to be serviced. Where the UPS 1 has the capability of reporting such states through the signal line 280, the control program of the MBA 200 may include the appropriate settings in a control table for the state transitions.

Returning to a normal operation state would require conforming to the conditions for a state transition that may include UPS online, UIB 120 breaker closed, and LBB 150 breaker open. In such a circumstance the MBA 200 would enable the MIB 140 to be closed and the MBB 130 to open. The processor would issue the appropriate commands, including sequencing the circuit breaker actions so that the MIB 140 is closed prior to opening the MBB 130, so that the UPS 1 is also supplying power to the load 60 during the transition and there is no break in the power supply to the load 60. The operator is prevented from inadvertently operating the circuit breakers in an improper order or leaving the MBA/UPS system in a condition where the UPS 1 and the bypass circuit are both providing power to the load 60 for an extended period of time.

Figure 6:
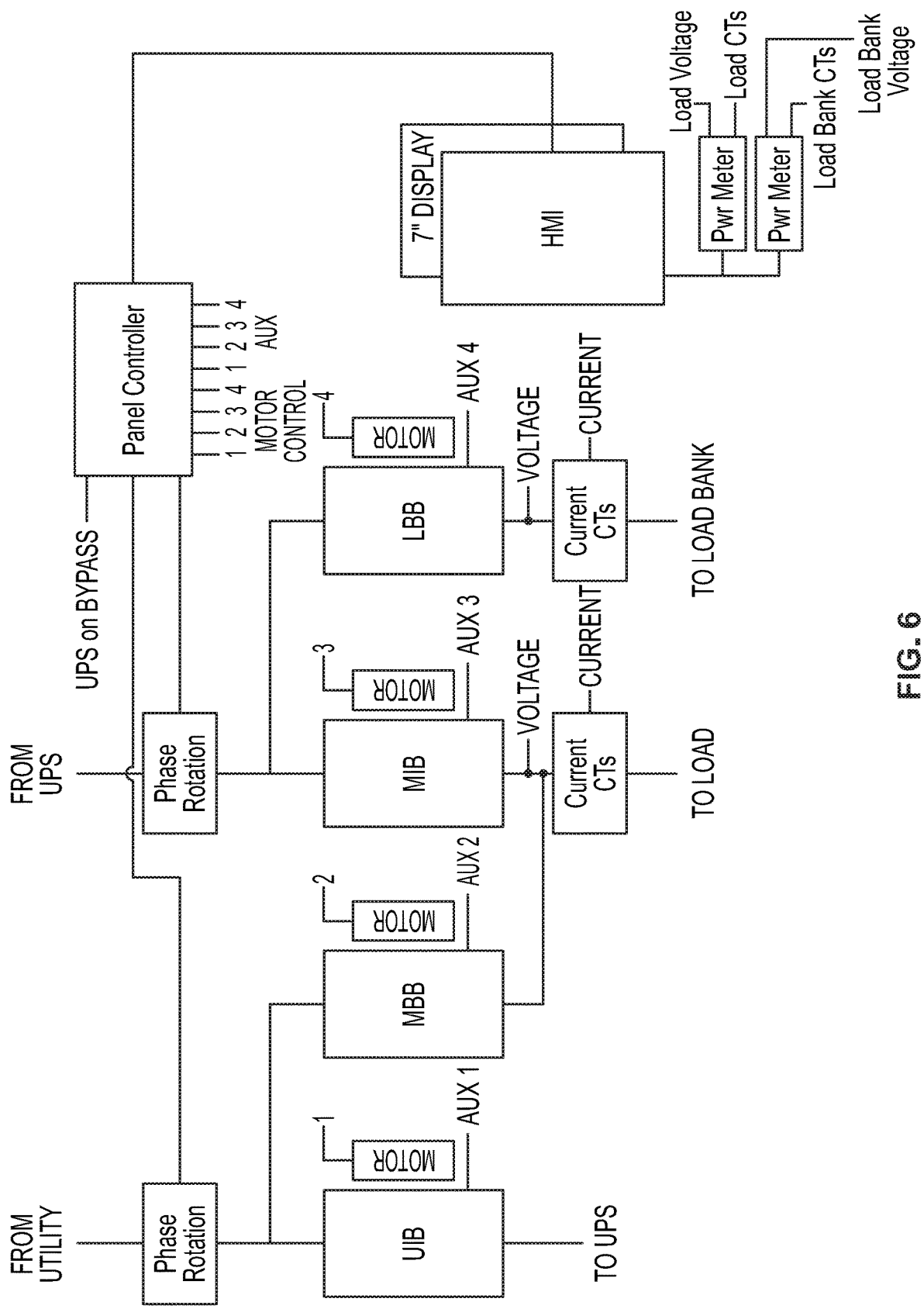
FIG. 6 is a functional block diagram of the MBA showing the control of the circuit breakers and sensors for voltage, phase and current which may be used to determine and control the state of the MBA.

In another aspect, FIG. 6 shows a more detailed one-line schematic of an MBA 200 configured for 3 phase power control. Here, each of the UIB, MBB, MIB and LBB are three-phase circuit breakers. This configuration may include phase rotation sensors 310. The phase rotation sensors sense the relative phase of each of the three lines in a 3-phase power system and compare the phases measured on the input lines with the phases measured at the output of the UPS 1. Unless the phases of the corresponding lines closely match (typically within 1 degree) a change in circuit breaker configuration may not be allowed. Such a phase mismatch could occur when a replacement UPS is installed and an error is made in the physical wiring connections, as many installations are not connectorized and the phase wires need to be individually connected. Phase errors may also occur when a secondary power source such as a backup generator is used, and either phasing has not yet been performed, the generator is misconnected, or the like. Connection of two power sources with mismatched phases is a serious fault and considerable damage to equipment would occur as well as being a hazard to personnel. As an example, motors may run backwards, exceptionally high currents may flow, and electronics may be destroyed.

The MBA 200 as shown in FIG. 6 includes current sensors and voltage sensors for system monitoring as well as to ensure that specific conditions exist on the power lines prior to making a change in system state.

By monitoring the states of the MBA 200 and the UPS 1, the system and method described prevents the system from entering undesired or dangerous states. For example, when the UPS is on-line the MBA 200 prevents the MBB 130 and the MIB 140 being ON at the same time.

Safe operation during the transitions between the normal operation mode and the maintenance bypass mode, includes determining that the UPS be in static bypass mode while the MBB 150 and the MIB 140 are both on. If the UPS 1 were to be connected to provide AC power to the load 60 when MBB 150 and MIB 140 were on, possible phase differences between the UPS 1 output and the utility power or generator power would result in a unwanted current flow that can damage the UPS 1 or the MBA 200 the equipment. For that reason, many of the UPS have an input signal that may be used to inhibit the UPS from going online.

During the transitions between the normal operation mode and the maintenance bypass mode, the processor of the MBA 200 controller may be configured to assert an output signal that can be connected to a UPS online inhibit input to prevent the UPS from going online while the MBB and the MIB are both on.

Voltage and current sensors may be employed to sense the present state of the MBA 200 and UPS 1 in order to determine that appropriate conditions exist for a state transition from, normal mode to maintenance bypass mode without damage and without loss of AC power to the load.

Where the remotely controlled operations are commanded by the operator through the graphical display, that action will only be completed if it complies with predetermined conditions and in the correct sequence. The individual circuit breaker control buttons are only enabled for the operator when actuation of the circuit breaker is permissible.

In a non-limiting example, an example of the conditions for transitioning between several acceptable operational states are shown in FIG. 7. The contact closures, voltage, current and phase measurements to confirm each the condition of each power line and each switch or circuit breaker may used to establish the current state of the configuration and when the change in configuration is initiated, each or the required action is performed in the predetermined sequence and confirmed prior to performing the next action in the sequence of actions.

In this example, only the input voltage, the UPS bypass state and the states of the remotely controlled circuit breakers are used. At the conclusion of the predetermined steps, the state change is confirmed and displayed to the operator. In this example, the state transitions of the circuit breakers or contactors is performed in the order shown in FIG. 7. Should any of the predetermined operations fail to be performed properly, the process is halted, and an error message is displayed. Portions of the sequence previously performed automatically may be reversed automatically or in response to an operator input. Depending on the nature of the fault, the operator may be offered one or more choices of actions to place the MBA/UPS configuration in a safe mode.

It will be appreciated by persons of skill in the art that the methods described and the control of the apparatus shown in the figures may be embodied in machine-executable instructions, e.g. software, in firmware or in hardware, or in a combination of both. The machine-executable instructions can be used to cause a general-purpose computer, a special-purpose processor, such as a DSP, array processor, microprocessor or the like, that acts on the instructions to perform functions and actions described herein, operating as a particular machine.

Alternatively, the operations might be performed by specific hardware components that may have hardwired logic or firmware instructions for performing the operations described, or by any combination of programmed computer components and custom hardware components, which may include analog circuits, electromechanical components, or the like. The computer components may include Application Specific Integrated Circuits (ASIC), Field Programmable Gate Arrays (FPGA), or the like which may exist or are being developed and have the capability of configurable logical operations.

The methods may be provided, at least in part, as a computer program product that may include a non-volatile (non-transient) machine-readable medium having stored thereon instructions which may be used to cause a computer (or other electronic devices) to perform the methods, including the control and sensing of the operation of mechanical components and relevant voltages or currents. For the purposes of this specification, the terms "machine-readable non-transient storage medium" shall be taken to include any tangible medium that is capable of storing or encoding a sequence of instructions or data for controlling a computing machine or special-purpose hardware and that may cause the machine or special purpose hardware to be operable to perform any one of the methodologies or functions of the methods and which retains relevant data when the power to the device is interrupted. The term "machine-readable medium" shall accordingly be taken include, but not be limited to, solid-state memories, optical and magnetic disks, magnetic memories, and optical memories, as well as any equivalent device that may be developed for such purpose.

For example, but not by way of limitation, a machine readable medium may include read-only memory (ROM); random access memory (RAM) of all types (e.g., S-RAM, D-RAM. P-RAM); programmable read only memory (PROM); electronically alterable read only memory (EPROM); magnetic random access memory; magnetic disk storage media; Flash memory, which may be NAND or NOR type; memory resistors; or electrical, optical, acoustical data storage medium, or the like. A volatile memory device such as DRAM may be used to store the computer program product provided that the volatile memory device is part of a system having a power supply, and the power supply or a battery provides power to the memory circuit for the time period during which the computer program product is stored on the volatile memory device.

For purposes of claim interpretation, the storage memory for storing a computer program product (including software, computer programming instructions, or "code") is "non-transient," where such a definition is given the broadest interpretation in terms of applicable memory types and techniques consistent with governing case law. Functions that are performed by a computer operable to process and execute the code may be equivalently performed by an electronic circuit that performs the same or similar acts.

Furthermore, it is common in the art to speak of software, in one form or another (e.g., program, procedure, process, application, module, algorithm or logic), as taking an action or causing a result. Such expressions are merely a convenient way of saying that execution of the instructions of the software by a computer or equivalent device causes or configures the processor of the computer or the equivalent device to perform or control an action or a produce a result, as is well known by persons skilled in the art.

When describing a particular example, the example may include a particular feature, structure, characteristic, or method step, but every example may not necessarily include the particular feature, structure, characteristic, or method step. This should not be taken as a suggestion or implication that the features, structure or characteristics of two or more examples should not or could not be combined, except when such a combination is explicitly excluded. When a particular feature, structure, or characteristic is described in connection with an example, a person skilled in the art may give effect to such feature, structure, or method step characteristic in connection with other examples, whether or not explicitly described.

In an example, a method of managing the connection between a external power source such as the power grid, a back-up generator or similar source of electrical power and the equipment (electrical load) to which the power is being supplied is described, where a UPS is interposed between the source of the power and the electrical load.

In addition to the UPS, the interface equipment may contain a plurality of electrically actuated switches, which may be circuit breakers, current or voltage sensors and a control unit, which may be a microprocessor, computer or other logical control device, a user display which may be a video display unit having touch-sensitive properties, or the equivalent, comprising discrete switches (which may be momentary actuated switches or push buttons and indicators), where only allowed a operations of a particular switch are enabled and these enabled operations are indicated visually. Other operations are inhibited.

The display indicates the current state of the MBS and the display or equivalent switch/indicator panel identifies only those device operations that are permitted, considering the current configuration of the apparatus. This may be determined by a state machine where the current state of the apparatus is associated with a particular truth table and the states to which the apparatus may be transitioned are each associated with individual unique truth tables.

When the operator input is interpreted to transition the state of the apparatus from the current state to the future state, the future state is one that corresponds to a predetermined truth table for the future state. There may be one or more future states whose truth tables are associated with the current state and the operator may choose one of them. A choice of a transition to a state without an associated truth table is not enabled.

For an enabled transition, the switches of the apparatus are actuated in a predetermined sequence so as to result in the configuration of the desired future state. After the transition, the future state becomes the desired new current state. Where manual operator intervention is part of the design, the operator-performed operation is confirmed either electrically or by the operator in accordance with the specific design implementation.

This process may be used to, for example, isolate the UPS for repairs, test the UPS into a dummy load, or the like.

It is therefore intended that the foregoing detailed description be regarded as illustrative rather than limiting, and that it be understood that it is the following claims, including all equivalents, that are intended to define the spirit and scope of this invention.

What is claimed is:
1. An electronic assembly comprising:
 a first interface configured to be connectable to alternating current (AC) power from an external source;
 a second interface configured to be connectable to an external AC load;

a third interface configured to be connectable from the first interface to an AC power input of an Uninterruptable Power Supply (UPS);
a fourth interface configured to be connectable to an AC power output of the UPS; and
a fifth interface configured to be connectable to a signal line of a UPS controller,
wherein the electronic assembly further comprises:
   a processor including volatile and non-volatile computer-readable memory;
   a plurality of remotely operated electrical switches, controlled by the processor;
      a first remotely operable electrical switch of the plurality of remotely operable electrical switches, is disposed between the first interface and the second interface; and
      a second remotely operable electrical switch of the plurality of remotely operable electrical switches, is disposed between the second interface and the fourth interface,
wherein, responsive to an operator command input received by the processor to change a configuration of a combination of the electronic assembly and the UPS when the UPS is connected to the electronic assembly through the third, the fourth and the fifth interfaces, the processor determines that the operator command can be performed safely, while the first interface is connected to the AC source and the second interface is connected to the AC load and providing AC power at the second interface; and, at least one safe configuration comprises a state such that the first remotely operable electrical switch is closed and the second remotely operable electrical switch is open; and, wherein the UPS comprises an AC-DC converter, a storage battery, a DC-AC converter, the UPS controller, and a static bypass switch.

2. The electronic assembly of claim 1 wherein a status of the static bypass switch of the UPS as enabled or disabled is sensed by the UPS controller in communication the fifth interface; and, a closure of the remotely operated electrical switch disposed between the first interface and the second interface is inhibited unless the status of enabled is sensed by the processor through the fifth interface.

3. The electronic assembly of claim 1 wherein the AC power is three phase power and the remotely operated switches switch three phases simultaneously.

4. The electronic assembly of claim 1, wherein a voltage sensor at the first interface is sensed by the processor to determine that an external AC power source is connected to the first interface prior to opening a third remotely operated electrical switch disposed between the second interface and the fourth interface.

5. The electronic assembly of claim 1, wherein one or more of the remotely actuated switches is a circuit breaker actuated by the processor to switch from an on state to an off state, or from the off state to the on state, or to reset to the on state after a trip state has been sensed.

6. The electronic assembly of claim 5, wherein the on state, the off state or the trip state of the circuit breaker is sensed by the processor based on a status of auxiliary contacts on the circuit breaker.

7. The electronic assembly of claim 5, wherein the state of the circuit breaker is changed by the electromechanical mechanism actuated by the processor.

8. The electronic assembly of claim 7, wherein the electromechanical mechanism includes a motor.

9. The electronic assembly of claim 1, wherein the remotely operated electrical switches are selected from a group comprising: a circuit breaker, a relay, or a contactor.

10. The electronic assembly of claim 9, wherein at least one of the remotely operated electrical switches is a motorized switch.

11. The electronic assembly of claim 10, wherein at least one of the remotely actuated switches is a motorized circuit breaker.

12. The electronic assembly of claim 1, wherein, when the processor determines that the operator input to change the configuration of the combination of the electronic assembly and the UPS results in a safe condition, the processor controls the remotely operated electrical switches to change the configuration.

13. The electronic assembly of claim 1, wherein the third and the fourth switches are external to the UPS.

* * * * *